(12) United States Patent
Marimuthu et al.

(10) Patent No.: US 8,017,515 B2
(45) Date of Patent: Sep. 13, 2011

(54) SEMICONDUCTOR DEVICE AND METHOD OF FORMING COMPLIANT POLYMER LAYER BETWEEN UBM AND CONFORMAL DIELECTRIC LAYER/RDL FOR STRESS RELIEF

(75) Inventors: Pandi C. Marimuthu, Singapore (SG); Nathapong Suthiwongsunthorn, Singapore (SG); Shuangwu Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 372 days.

(21) Appl. No.: 12/332,325

(22) Filed: Dec. 10, 2008

(65) Prior Publication Data

US 2010/0140752 A1 Jun. 10, 2010

(51) Int. Cl.
*H01L 21/44* (2006.01)
*H01L 23/48* (2006.01)

(52) U.S. Cl. ........ 438/612; 438/613; 438/614; 257/737; 257/738; 257/750; 257/758; 257/E23.021; 257/E23.069

(58) Field of Classification Search .................. 257/737, 257/738, E23.021, E23.069, 734, 735, 750, 257/758, 780–784; 438/612, 613, 614
See application file for complete search history.

(56) References Cited

U.S. PATENT DOCUMENTS 6,455,408 B1 * 9/2002 Hwang et al. ................. 438/613
2006/0084259 A1 4/2006 Tsai

* cited by examiner

*Primary Examiner* — Jasmine J Clark
(74) *Attorney, Agent, or Firm* — Robert D. Atkins; Patent Law Group

(57) ABSTRACT

A semiconductor device has a first conductive layer formed over a top surface of a substrate. A first insulating layer is formed over the substrate. A first dielectric layer is formed over the first insulating layer. A second conductive layer is formed over the first conductive layer and first dielectric layer. A second dielectric layer is formed over the second conductive layer. A polymer material is deposited over the second dielectric layer and second conductive layer. A third conductive layer is formed over the polymer material and second conductive layer. The third conductive layer is electrically connected to the second conductive layer. A first solder bump is formed over the third conductive layer. A conductive via is formed through a back surface of the substrate. The conductive via is electrically connected to the first conductive layer. The polymer material has a low coefficient of thermal expansion.

24 Claims, 7 Drawing Sheets

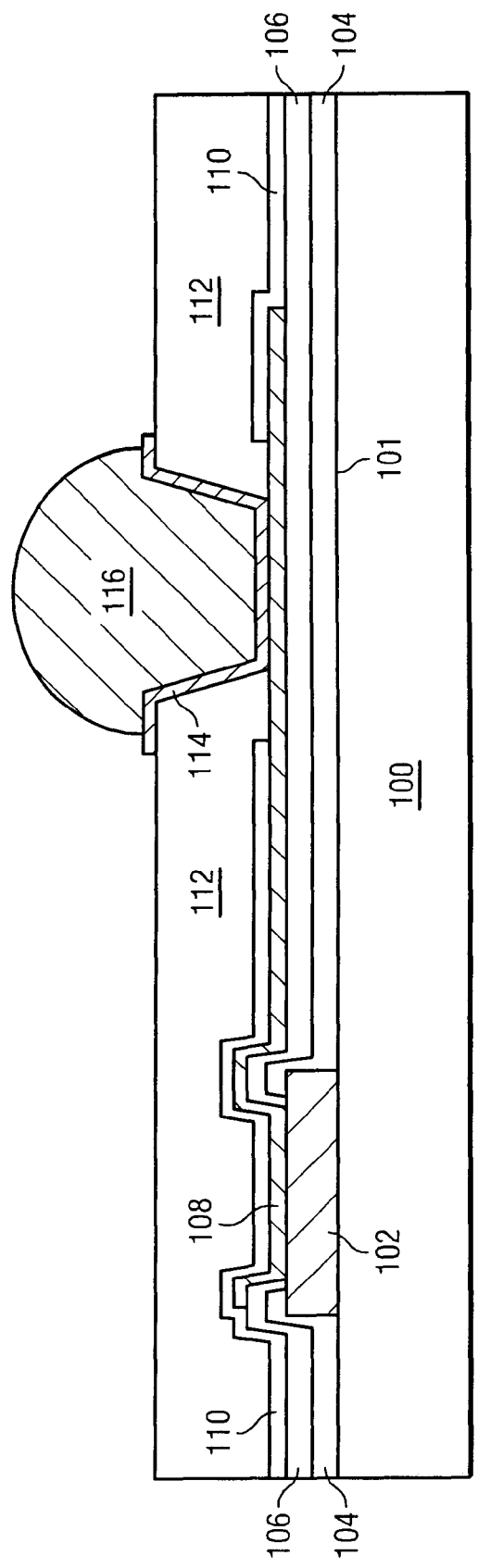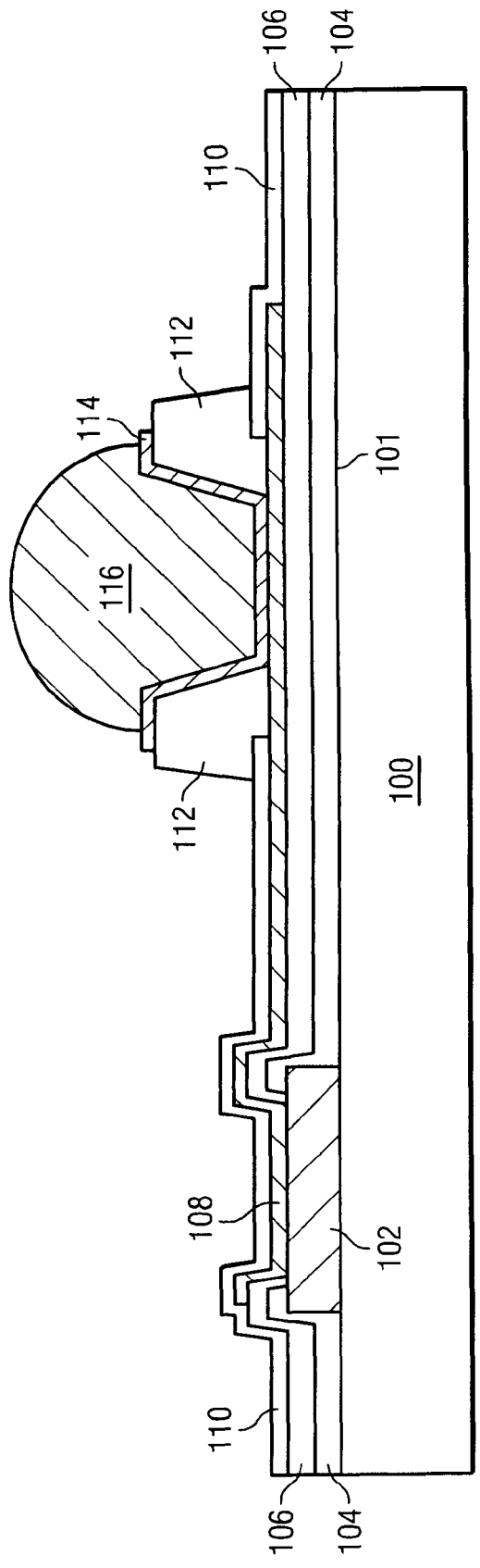

SEMICONDUCTOR DEVICE AND METHOD OF FORMING COMPLIANT POLYMER LAYER BETWEEN UBM AND CONFORMAL DIELECTRIC LAYER/RDL FOR STRESS RELIEF

FIELD OF THE INVENTION

The present invention relates in general to semiconductor devices and, more particularly, to a semiconductor device having a compliant polymer material disposed between an under bump metallization and conformal dielectric layer and RDL for stress relief.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, such as wafer-level packaging (WLP), system-in-package (SiP), package-on-packaging (PoP), and other high-yield wafers, the interconnect structures require miniaturization and small features to achieve the necessary levels of integration, particularly with respect to through silicon vias (TSV) and ultra fine pitch interconnect. TSV offers thermal and electrical advantages due to its small dimension and reduced power consumption in comparison with bond wires. TSV provides a high level of integration with heterogeneous processes. TSV also provides for size reduction for ultra thin and compact stacks of chips for miniature applications.

In these packages, a common issue involves a mismatch in the coefficient of thermal expansion (CTE) between multilayer, dissimilar materials, e.g., between UBM, RDL, and associated insulating layers. The CTE mismatch creates high stress during reliability testing, which can lead to premature fatigue or failure. For example, a memory device may use a thick passivation layer, e.g., polyimide, under the UBM to prevent attack from the trace-amounted α-particles found in the molding compound. The thick polyimide and adjacent UBM and RDL have different CTEs which causes internal stress in the temperature-oriented reliability testing.

SUMMARY OF THE INVENTION

A need exists to provide stress relief for CTE dissimilar materials during reliability testing. Accordingly, in one embodiment, the present invention is a method of manufacturing a semiconductor device comprising the steps of providing a substrate, forming a first conductive layer over a top surface of the substrate, forming a first insulating layer over the substrate, forming a first conformal dielectric layer over the first insulating layer, forming a second conductive layer over the first conductive layer and first conformal dielectric layer, forming a second conformal dielectric layer over the second conductive layer, depositing a compliant polymer material over the second conformal dielectric layer and second conductive layer, and forming a third conductive layer over the compliant polymer material and second conductive layer. The third conductive layer is electrically connected to the second conductive layer. The method further includes the step of forming a first solder bump over the third conductive layer.

In another embodiment, the present invention is a method of manufacturing a semiconductor device comprising the steps of providing a substrate, forming a first conductive layer over a top surface of the substrate, forming a first insulating layer over the substrate, forming a first dielectric layer over the first insulating layer, forming a second conductive layer over the first conductive layer and first dielectric layer, forming a second dielectric layer over the second conductive layer, depositing a polymer material over the second dielectric layer and second conductive layer, and forming a third conductive layer over the polymer material and second conductive layer. The third conductive layer is electrically connected to the second conductive layer.

In another embodiment, the present invention is a method of manufacturing a semiconductor device comprising the steps of providing a substrate, forming a first conductive layer over a top surface of the substrate, forming a first insulating layer over the substrate, forming a second conductive layer over the first conductive layer and first insulating layer, depositing a polymer material over the second conductive layer, and forming a third conductive layer over the second conductive layer. The third conductive layer is electrically connected to the second conductive layer.

In another embodiment, the present invention is a semiconductor device comprising a substrate and first conductive layer formed over a top surface of the substrate. A first insulating layer is formed over the substrate. A first dielectric layer is formed over the first insulating layer. A second conductive layer is formed over the first conductive layer and first dielectric layer. A second dielectric layer is formed over the second conductive layer. A polymer material is deposited over the second dielectric layer and second conductive layer. A third conductive layer is formed over the polymer material and second conductive layer. The third conductive layer is electrically connected to the second conductive layer.

BRIEF DESCRIPTION OF THE DRAWINGS

FIG. 3 illustrates a process of forming a compliant polymer material between UBM, RDL, and conformal dielectric layer;

FIG. 4 illustrates removing a portion of the compliant polymer material;

DETAILED DESCRIPTION OF THE DRAWINGS

Figure 1:
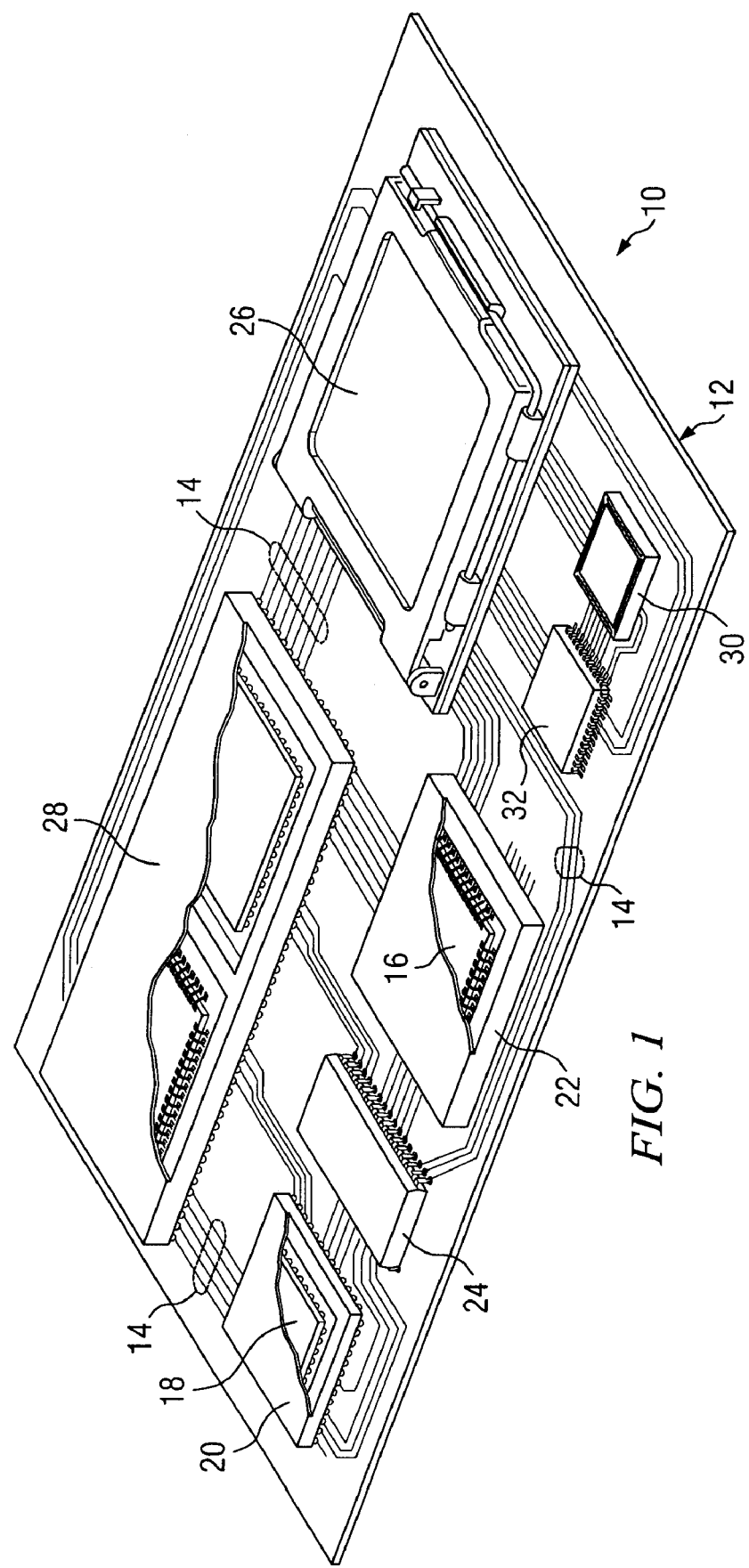
FIG. 1 illustrates a PCB with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
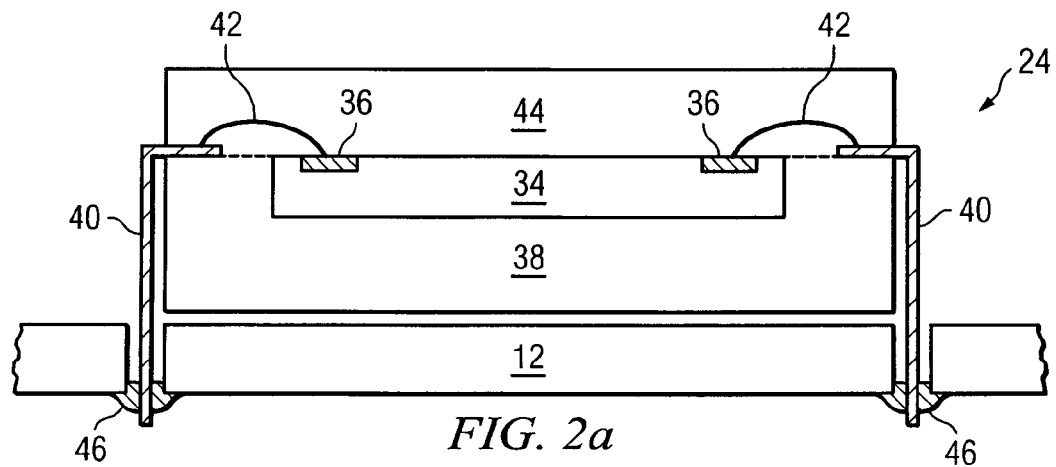
FIGS. 2a-2c illustrate further detail of the semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
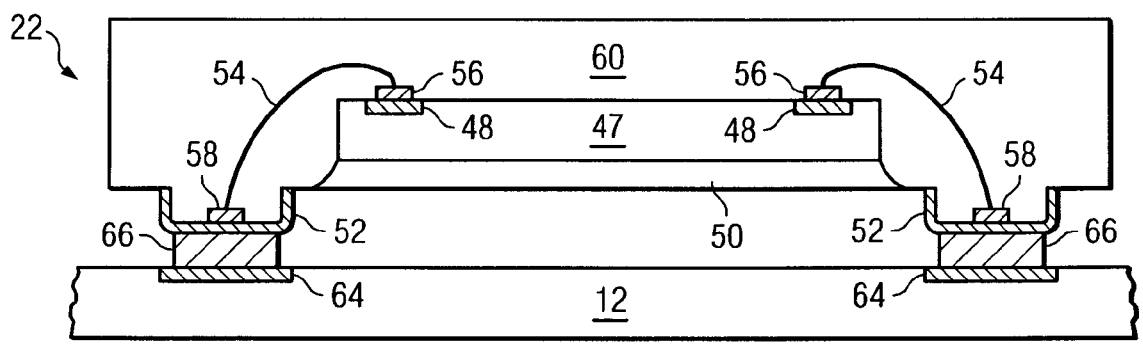

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
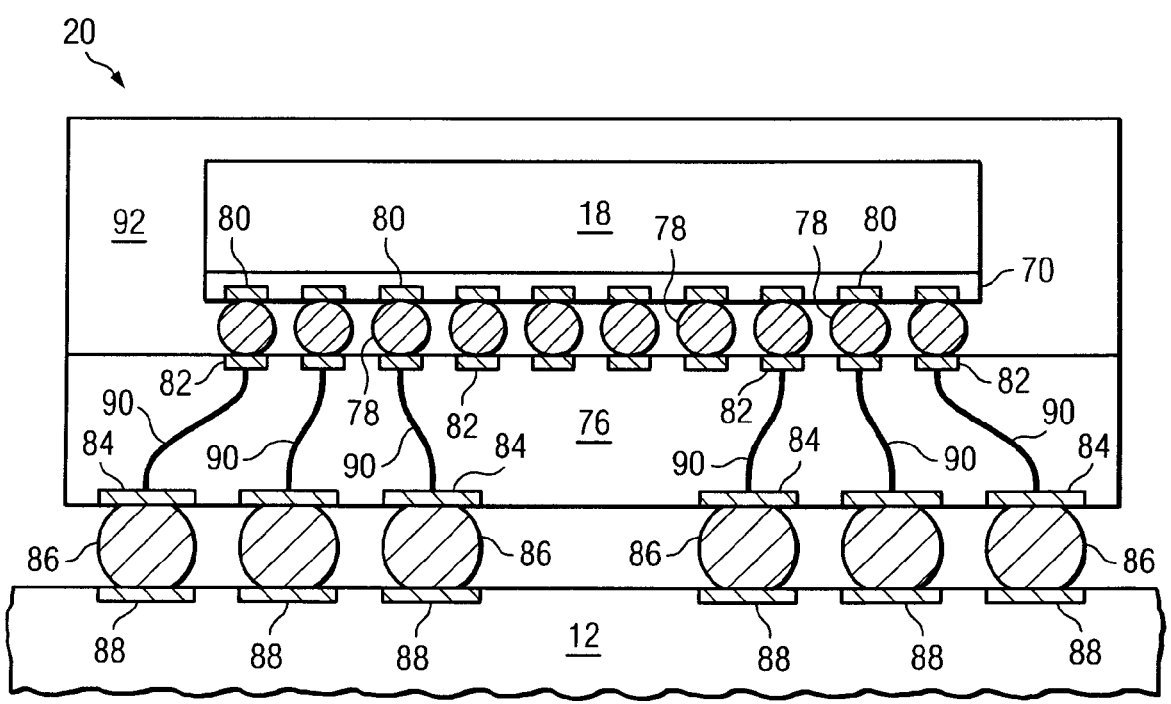

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

FIG. 3 shows a substrate or wafer 100 made with a semiconductor base material such as germanium, gallium arsenide, indium phosphide, or silicon carbide. A plurality of semiconductor die is formed on substrate 100 using semiconductor manufacturing processes described above. Each semiconductor die has active and passive devices, integrated passive devices (IPD), conductive layers, and dielectric layers formed on top active surface 101 according to the electrical design of the die. In one embodiment, the semiconductor die contains baseband digital circuits, such as digital signal processor (DSP), memory, or other signal processing circuit. The semiconductor die may also contain IPD, such as inductors, capacitors, and resistor, for radio frequency (RF) signal processing.

An electrically conductive layer 102 is patterned and deposited over substrate 100. Conductive layer 102 can be Al, Cu, Sn, Ni, Au, Ag, or other suitable electrically conductive material. The deposition of conductive layer 102 uses PVD, CVD, electrolytic plating, or electroless plating process. Conductive layer 102 operates as a contact pad having electrical connection to the active and passive devices, IPDs, and conductive layers disposed in active surface 101.

A passivation or insulating layer 104 is formed over substrate 100 and conductive layer 102. The passivation layer 104 can be silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), or other material having suitable insulating properties. The passivation layer 104 is patterned or blanket deposited using PVD, CVD, printing, spin coating, sintering, or thermal oxidation. The passivation layer 104 can be single or multiple layers. A portion of passivation layer 104 is removed by an etching process to expose conductive layer 102.

A dielectric layer 106 is conformally applied over insulating layer 104 and conductive layer 102. The conformal dielectric layer 106 can be $SiO_2$, $Si_3N_4$, SiON, $Ta_2O_5$, $ZrO_2$, $Al_2O_3$, or other material having insulating properties. The dielectric layer 106 is patterned or blanket deposited using PVD, CVD, printing, spin coating, sintering, or thermal oxidation. The dielectric layer 106 can be single or multiple layers. In one embodiment, dielectric layer 106 is parylene or fluorinated polymers applied using low-temperature deposition, in the range of 25-60° C. A portion of dielectric layer 106 is removed by an etching process to expose conductive layer 102.

An electrically conductive layer 108 is patterned and deposited over dielectric layer 106 and conductive layer 102. Conductive layer 108 can be Al, Cu, Sn, Ni, Au, Ag, or other suitable electrically conductive material. The deposition of conductive layer 108 uses PVD, CVD, electrolytic plating, or electroless plating process. Conductive layer 108 operates as a runner or redistribution layer (RDL) to extend the interconnectivity of conductive layer 102.

A dielectric layer 110 is conformally applied over dielectric layer 106 and conductive layer 108. The conformal dielectric layer 110 can be $SiO_2$, $Si_3N_4$, SiON, $Ta_2O_5$, $ZrO_2$, $Al_2O_3$, or other material having insulating properties. The dielectric layer 110 is patterned or blanket deposited using PVD, CVD, printing, spin coating, sintering, or thermal oxidation. The dielectric layer 110 can be single or multiple layers. In one embodiment, dielectric layer 110 is parylene or fluorinated polymers applied using low temperature deposition, e.g., in the range of 25-60° C. A portion of dielectric layer 110 is removed by an etching process to expose conductive layer 108.

A compliant polymer material 112 is applied over conductive layer 108 and conformal dielectric layer 110 using spray coating, spin coating, or photolithographic process. FIG. 4 shows an embodiment with a portion of polymer material 112 removed by an etching process to expose conformal dielectric layer 110. In this case, compliant polymer material 112 partially covers dielectric layer 110.

An electrically conductive layer 114 is patterned and deposited over polymer material 112 and conductive layer 108. Conductive layer 114 can be Al, Cu, Sn, Ni, Au, Ag, or other suitable electrically conductive material. The deposition of conductive layer 114 uses PVD, CVD, electrolytic plating, or electroless plating process. Conductive layer 114 operates as an under bump metallization layer (UBM) or bump pad for conductive layer 108. UBM 114 can be a multi-metal stack with adhesion layer, barrier layer, and seed or wetting layer. The adhesion layer is formed over conductive layer 108 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 108 and subsequent solder bumps or other interconnect structure. UBM 114 provides a low resistive interconnect to conductive layer 108, as well as a barrier to solder diffusion and seed layer for solder wettability.

An electrically conductive solder material is deposited over conductive layer 114 using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 116. In some applications, solder bump 116 is reflowed a second time to improve electrical contact to conductive layer 114.

During the heating process, high stresses can be induced due to a mismatch in coefficient of thermal expansion (CTE) between multi-layer materials of different composition, e.g., between RDL 108, dielectric layer 110, UBM 114, and solder bump 116. In other words, one material expands more than the other material in response to heat, which creates pressure in terms of a stress distribution curve across the boundary between the dissimilar materials. To reduce the stress, compliant polymer material 112, which has a low CTE and modulus, is disposed between the CTE-mismatched materials, e.g., between UBM 114, RDL 108, and conformal dielectric layer 110. The compliant polymer material has a CTE which is less than CTE of conformal dielectric layer 110, conductive layer 108, and conductive layer 114. The polymer material 112 controls the stress distribution curve to enhance reliability during testing and reduce package warpage in large-sized, wafer level packages, and ultra-thin wafers. In addition, conformal dielectric layers 106 and 110 are positioned above and below RDL 108 which provides surface protection from oxidation and reduces effects of α-particle attack. Accordingly, compliant polymer material 112 and conformal dielectric layers 106 and 110 reduce internal stresses and improve the performance of the WLP, particularly during reliability testing.

Figure 5:
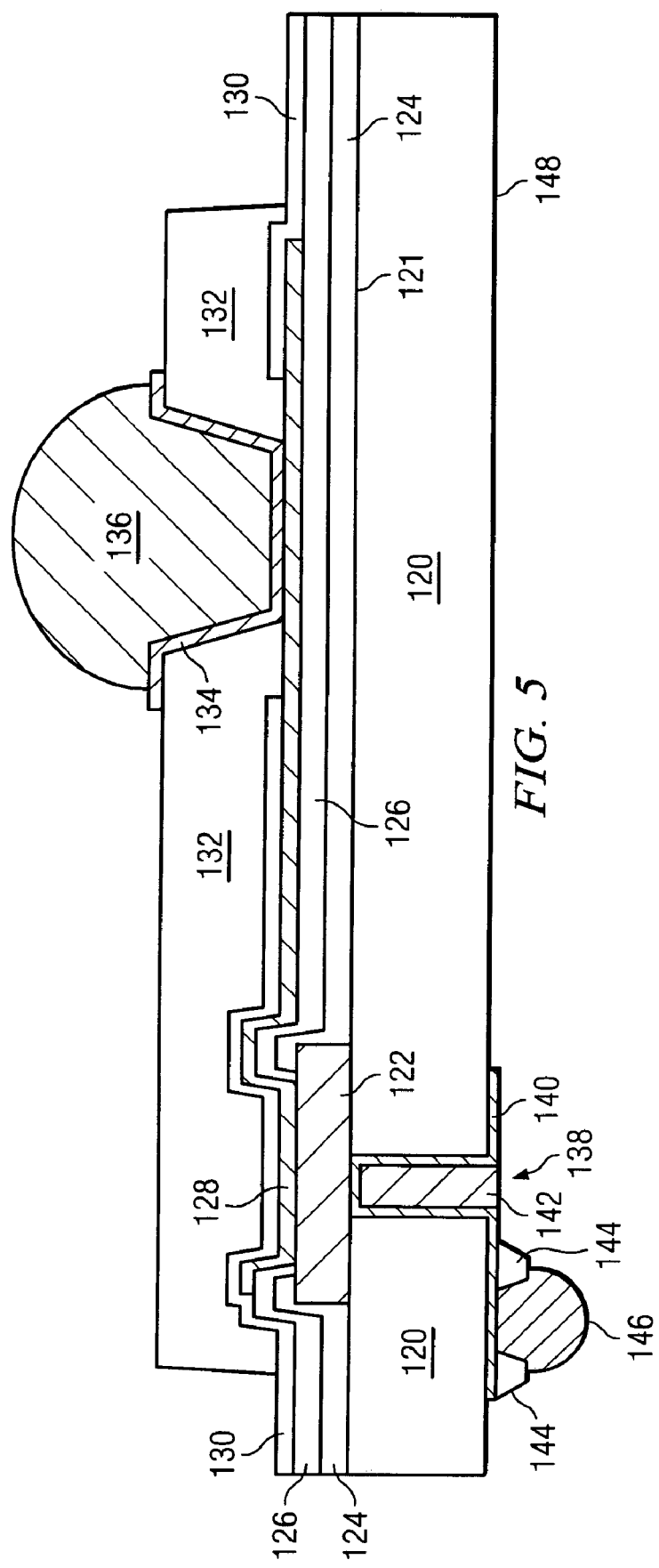
FIG. 5 illustrates a process of forming the compliant polymer material between UBM, RDL, and conformal dielectric layer with backside vertical conductive via having vertical sidewalls.

In FIG. 5, a substrate or wafer 120 is made with a semiconductor base material such as germanium, gallium arsenide, indium phosphide, or silicon carbide. A plurality of semiconductor die is formed on substrate 120 using semiconductor manufacturing processes described above. Each semiconductor die has active and passive devices, IPD, conductive layers, and dielectric layers formed on top active surface 121 according to the electrical design of the die. In one embodiment, the semiconductor die contains baseband digital circuits, such as DSP, memory, or other signal processing circuit. The semiconductor die may also contain IPD, such as inductors, capacitors, and resistor, for RF signal processing.

An electrically conductive layer 122 is patterned and deposited over a top-side of substrate 120. Conductive layer 122 can be Al, Cu, Sn, Ni, Au, Ag, or other suitable electrically conductive material. The deposition of conductive layer 122 uses PVD, CVD, electrolytic plating, or electroless plating process. Conductive layer 122 operates as a contact pad having electrical connection to the active and passive devices, IPDS, and conductive layers disposed in active surface 121.

A passivation or insulating layer 124 is formed over substrate 120 and conductive layer 122. The passivation layer 124 can be SiO2, Si3N4, SiON, Ta2O5, ZrO2, Al2O3, polyimide, BCB, PBO, or other material having suitable insulating properties. The passivation layer 124 is patterned or blanket deposited using PVD, CVD, printing, spin coating, sintering, or thermal oxidation. The passivation layer 124 can be single or multiple layers. A portion of passivation layer 124 is removed by an etching process to expose conductive layer 122.

A dielectric layer 126 is conformally applied over insulating layer 124 and conductive layer 122. The conformal dielectric layer 126 can be SiO2, Si3N4, SiON, Ta2O5, ZrO2, Al2O3, or other material having insulating properties. The dielectric layer 126 is patterned or blanket deposited using PVD, CVD, printing, spin coating, sintering, or thermal oxidation. The dielectric layer 126 can be single or multiple layers. In one embodiment, dielectric layer 126 is parylene or fluorinated polymers applied using low-temperature deposition, in the range of 25-60° C. A portion of dielectric layer 126 is removed by an etching process to expose conductive layer 122.

An electrically conductive layer 128 is patterned and deposited over dielectric layer 126 and conductive layer 122. Conductive layer 128 can be Al, Cu, Sn, Ni, Au, Ag, or other suitable electrically conductive material. The deposition of conductive layer 128 uses PVD, CVD, electrolytic plating, or electroless plating process. Conductive layer 128 operates as a runner or RDL to extend the interconnectivity of conductive layer 122.

A dielectric layer 130 is conformally applied over dielectric layer 126 and conductive layer 128. The conformal dielectric layer 130 can be SiO2, Si3N4, SiON, Ta2O5, ZrO2, Al2O3, or other material having insulating properties. The dielectric layer 130 is patterned or blanket deposited using PVD, CVD, printing, spin coating, sintering, or thermal oxidation. The dielectric layer 130 can be single or multiple layers. In one embodiment, dielectric layer 130 is parylene or fluorinated polymers applied using low temperature deposition, e.g., in the range of 25-60° C. A portion of dielectric layer 130 is removed by an etching process to expose conductive layer 128.

Figure 6:
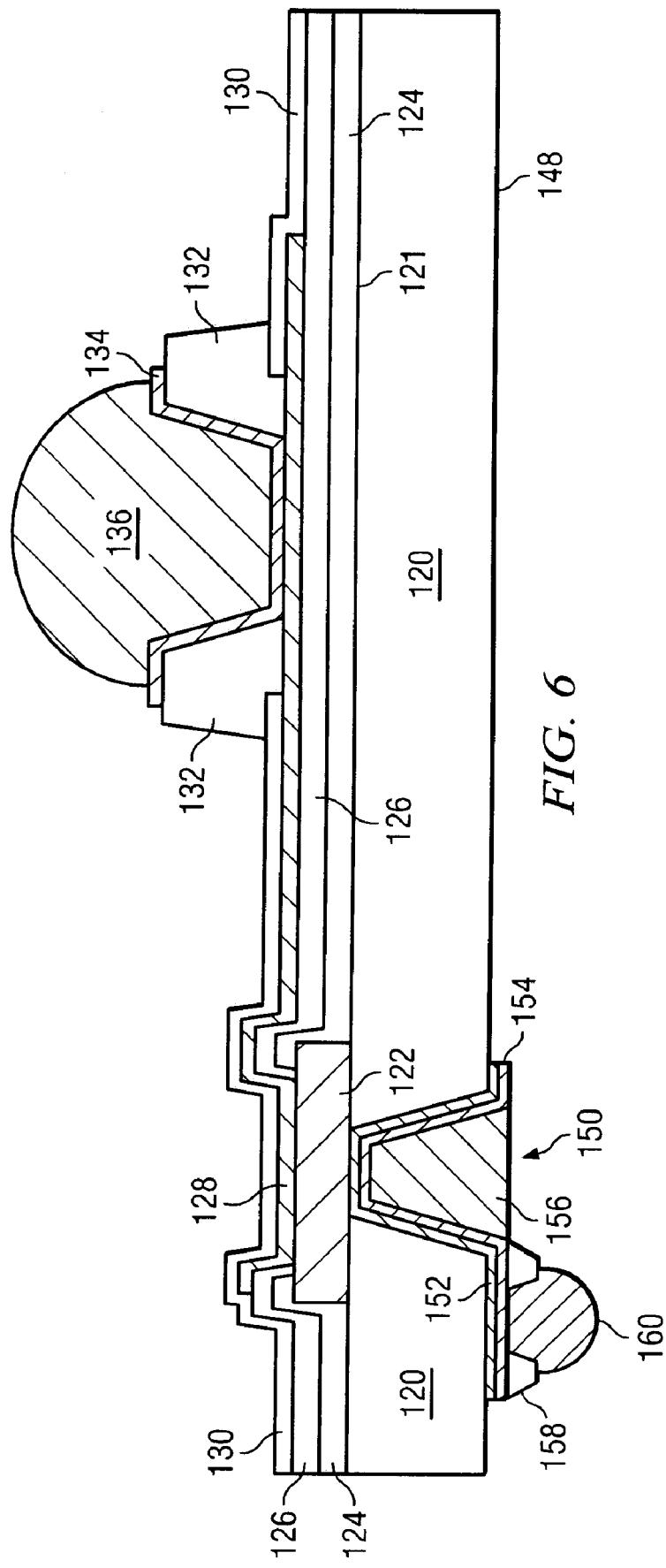
FIG. 6 illustrates a process of forming the compliant polymer material between UBM, RDL, and conformal dielectric layer with backside conductive via having tapered sidewalls.

A compliant polymer material 132 is applied over conductive layer 128 and conformal dielectric layer 130 using spray coating, spin coating, or photolithographic process. FIG. 6 shows an embodiment with a portion of polymer material 132 removed by an etching process to expose conformal dielectric layer 130. In this case, compliant polymer material 132 partially covers dielectric layer 130.

An electrically conductive layer 134 is patterned and deposited over polymer material 132 and conductive layer 128. Conductive layer 134 can be Al, Cu, Sn, Ni, Au, Ag, or other suitable electrically conductive material. The deposition of conductive layer 134 uses PVD, CVD, electrolytic plating, or electroless plating process. Conductive layer 134 operates as a UBM or bump bad for conductive layer 128. UBM 134 can be a multi-metal stack with adhesion layer, barrier layer, and seed or wetting layer. The adhesion layer is formed over conductive layer 128 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 128 and subsequent solder bumps or other interconnect structure. UBM 134 provides a low resistive interconnect to conductive layer 128, as well as a barrier to solder diffusion and seed layer for solder wettability.

An electrically conductive solder material is deposited over conductive layer 134 using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 136. In some applications, solder bump 136 is reflowed a second time to improve electrical contact to conductive layer 134.

A via 138 is formed on a backside of substrate 120, opposite conductive layer 122, using trench etching with SiN mask or laser drilling. Via 138 extends through substrate 120 to conductive layer 122. The sidewalls of via 138 have a vertical geometry. An electrically conductive layer 140 is patterned and deposited over the backside of substrate 120 and into via 138. Conductive layer 140 electrically connects to conductive layer 122. Conductive layer 140 can be Al, Cu, Sn, Ni, Au, Ag, or other suitable electrically conductive material. The deposition of conductive layer 140 uses PVD, CVD, electrolytic plating, or electroless plating process.

Via 138 is filled with conductive material 142 to formed a conductive through silicon via (TSV). Conductive material 142 can be Al, Cu, Sn, Ni, Au, Ag, or other suitable electrically conductive material. The deposition of conductive material 142 uses PVD, CVD, electrolytic plating, or electroless plating process.

A passivation or insulating layer 144 is formed over conductive layer 140. The passivation layer 144 can be SiO2, Si3N4, SiON, Ta2O5, ZrO2, Al2O3, polyimide, BCB, PBO, or other material having suitable insulating properties. The passivation layer 144 is patterned or blanket deposited using PVD, CVD, printing, spin coating, sintering, or thermal oxidation. The passivation layer 144 can be single or multiple layers. A portion of passivation layer 144 is removed by an etching process to expose conductive layer 140.

An electrically conductive solder material is deposited over conductive layer 140 using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 146. In some applications, solder bump 146 is reflowed a second time to improve electrical contact to conductive layer 140.

FIG. 6 shows another embodiment of the TSV. A via 150 is formed on back surface 148 of substrate 120, opposite conductive layer 122, using trench etching with SiN mask or laser drilling. Via 150 extends through substrate 120 to conductive layer 122. The sidewalls of via 150 have a tapered geometry. A first electrically conductive layer 152 is patterned and deposited over the backside of substrate 120 and into via 150. A second electrically conductive layer 154 is patterned and deposited over conductive layer 152. In this case, conductive layers 152-154 act as barrier, seed, or adhesive layers. Conductive layers 152 and 154 can be Al, Cu, Sn, Ni, Au, Ag, or other suitable electrically conductive material. The deposition of conductive layers 152 and 154 use PVD, CVD, electrolytic plating, or electroless plating process. Conductive layers 152 and 154 electrically connect to conductive layer 122.

Via 150 is filled with conductive material 156 to formed a conductive TSV. Conductive material 156 can be Al, Cu, Sn, Ni, Au, Ag, or other suitable electrically conductive material. The deposition of conductive material 156 uses PVD, CVD, electrolytic plating, or electroless plating process.

A passivation or insulating layer 158 is formed over conductive layer 154. The passivation layer 158 can be SiO2, Si3N4, SiON, Ta2O5, ZrO2, Al2O3, polyimide, BCB, PBO, or other material having suitable insulating properties. The passivation layer 158 is patterned or blanket deposited using PVD, CVD, printing, spin coating, sintering, or thermal oxidation. The passivation layer 158 can be single or multiple layers. A portion of passivation layer 158 is removed by an etching process to expose conductive layer 154.

An electrically conductive solder material is deposited over conductive layer 154 using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 160. In some applications, solder bump 160 is reflowed a second time to improve electrical contact to conductive layer 140.

During the heating process, high stresses can be induced due to a mismatch in CTE between multi-layer materials of different composition, e.g., between RDL 128, dielectric layer 130, UBM 134, and solder bump 136. In other words, one material expands more than the other material in response to heat, which creates pressure in terms of a stress distribution curve across the boundary between the dissimilar materials. To reduce the pressure, compliant polymer material 132, which has a low CTE and modulus, is disposed between the CTE-mismatched materials, e.g., between UBM 134, RDL 128, and conformal dielectric layer 130. The compliant polymer material 132 has a CTE which is less than CTE of conformal dielectric layer 130, conductive layer 128, and conductive layer 134. The polymer material 132 controls the stress distribution curve to enhance reliability during testing and reduce package warpage in large-sized, wafer level packages, and ultra-thin wafers. In addition, conformal dielectric layers 126 and 130 are positioned above and below RDL 128 which provides surface protection from oxidation and reduces effects of α-particle attack. Accordingly, compliant polymer material 132 and conformal dielectric layers 126 and 130 reduce internal stresses and improve the performance of the WLP, particularly during reliability testing.

Figure 7:
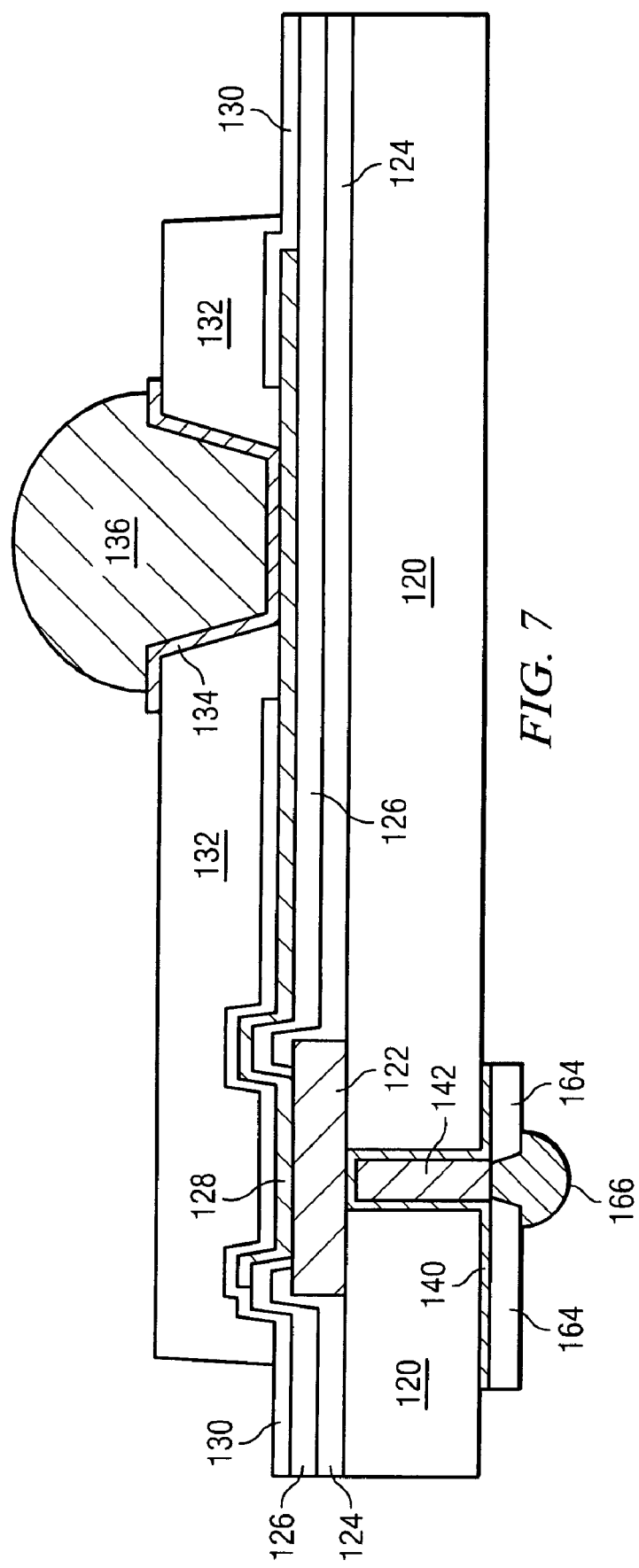
FIG. 7 illustrates a process of forming the compliant polymer material between UBM, RDL, and conformal dielectric layer with backside vertical conductive via and solder bump.

FIG. 7 shows a variation of the backside solder bump from the embodiment in FIG. 5. In this case, a passivation or insulating layer 164 is formed over conductive layer 140 and conductive material 142. The passivation layer 164 can be SiO2, Si3N4, SiON, Ta2O5, ZrO2, Al2O3, polyimide, BCB, PBO, or other material having suitable insulating properties. The passivation layer 164 is patterned or blanket deposited using PVD, CVD, printing, spin coating, sintering, or thermal oxidation. The passivation layer 164 can be single or multiple layers. A portion of passivation layer 164 is removed by an etching process to expose conductive material 142.

An electrically conductive solder material is deposited over conductive material 142 using an evaporation, electrolytic plating, electroless plating, ball drop, or screen printing process. The solder material can be any metal or other electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical ball or bump 166. In some applications, solder bump 166 is reflowed a second time to improve electrical contact to conductive material 142.

Figure 8:
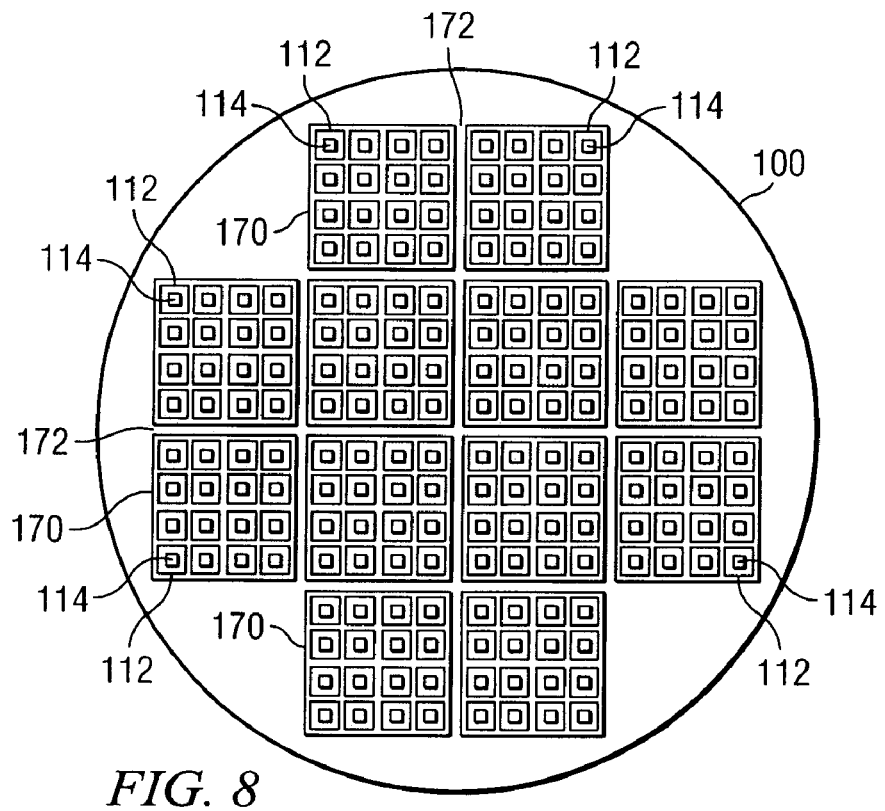
FIG. 8 illustrates a top view of the compliant polymer material surrounding the UBM.

FIG. 8 shows a top view of substrate 100 containing a plurality of semiconductor die 170 separated by saw streets or scribe lines 172. Compliant polymer material 112 surrounds each UBM 114 of semiconductor die 170 to reduce internal stress and improve reliability during testing.

Figure 9:
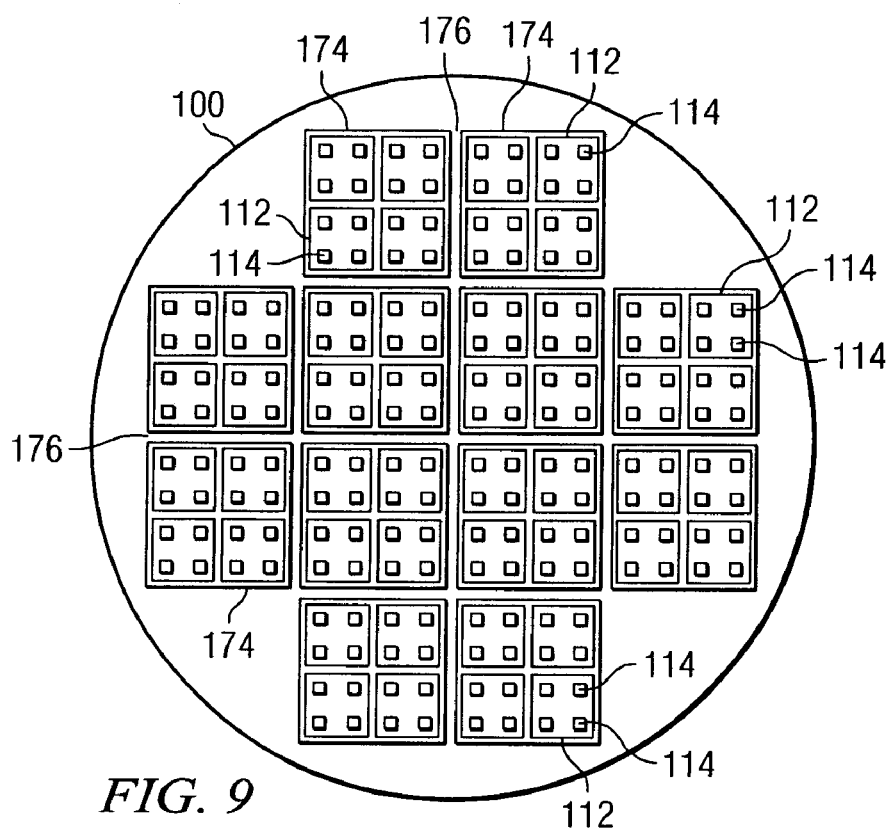
FIG. 9 illustrates a top view of the compliant polymer material surrounding a group of UBMs.

FIG. 9 shows a top view of substrate 100 containing a plurality of semiconductor die 174 separated by saw street or scribe lines 176. Compliant polymer material 112 surrounds a group of UBM 114 of semiconductor die 174 to reduce internal stress and improve reliability during testing.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a substrate;
   forming a first conductive layer over a top surface of the substrate;
   forming a first insulating layer over the substrate;
   forming a first conformal dielectric layer over the first insulating layer;
   forming a second conductive layer over the first conductive layer and first conformal dielectric layer;
   forming a second conformal dielectric layer over the second conductive layer;
   depositing a compliant polymer material over the second conformal dielectric layer and second conductive layer;
   forming a third conductive layer over the compliant polymer material and second conductive layer, the third conductive layer being electrically connected to the second conductive layer; and
   forming a first solder bump over the third conductive layer.

2. The method of claim 1, further including removing a portion of the compliant polymer material over the second conformal dielectric layer.

3. The method of claim 1, further including forming a conductive via through a back surface of the substrate, opposite the top surface of the substrate, the conductive via being electrically connected to the first conductive layer.

4. The method of claim 3, wherein the conductive via has vertical or tapered sidewalls.

5. The method of claim 3, further including forming a second solder bump over the conductive via.

6. The method of claim 3, further including:
   forming a fourth conductive layer over the back surface of the substrate and into the conductive via, the fourth conductive layer being electrically connected to the first conductive layer;
   forming a second insulating layer over the fourth conductive layer;
   removing a portion of the second insulating layer to expose the fourth conductive layer; and
   forming a second solder bump over the fourth conductive layer.

7. The method of claim 1, wherein the compliant polymer material has a coefficient of thermal expansion (CTE) which is less than CTE of the second conformal dielectric layer, second conductive layer, and third conductive layer.

8. A method of manufacturing a semiconductor device, comprising:
   providing a substrate;
   forming a first conductive layer over a top surface of the substrate;
   forming a first insulating layer over the substrate;
   forming a first dielectric layer over the first insulating layer;
   forming a second conductive layer over the first conductive layer and first dielectric layer;
   forming a second dielectric layer over the second conductive layer;
   depositing a polymer material over the second dielectric layer and second conductive layer; and
   forming a third conductive layer over the polymer material and second conductive layer, the third conductive layer being electrically connected to the second conductive layer.

9. The method of claim 8, further including forming a solder bump over the third conductive layer.

10. The method of claim 8, further including removing a portion of the polymer material over the second conformal dielectric layer.

11. The method of claim 8, further including forming a conductive via through a back surface of the substrate, opposite the top surface of the substrate, the conductive via being electrically connected to the first conductive layer.

12. The method of claim 11, wherein the conductive via has vertical or tapered sidewalls.

13. The method of claim 11, further including forming a solder bump over the conductive via.

14. The method of claim 11, further including:
   forming a fourth conductive layer over the back surface of the substrate and into the conductive via, the fourth conductive layer being electrically connected to the first conductive layer; and
   forming a second insulating layer over the fourth conductive layer;
   removing a portion of the second insulating layer to expose the fourth conductive layer; and
   forming a solder bump over the fourth conductive layer.

15. The method of claim 8, wherein the polymer material has a coefficient of thermal expansion (CTE) which is less than CTE of the second dielectric layer, second conductive layer, and third conductive layer.

16. A method of manufacturing a semiconductor device, comprising:
   providing a substrate;
   forming a first conductive layer over a top surface of the substrate;
   forming a first insulating layer over the substrate;
   forming a second conductive layer over the first conductive layer and first insulating layer;
   depositing a polymer material over the second conductive layer;
   forming a third conductive layer over the second conductive layer, the third conductive layer being electrically connected to the second conductive layer;
   forming a first dielectric layer over the first insulating layer; and
   forming a second dielectric layer over the second conductive layer.

17. The method of claim 16, wherein the polymer material has a coefficient of thermal expansion (CTE) which is less than CTE of the second dielectric layer, second conductive layer, and third conductive layer.

18. The method of claim 16, further including forming a conductive via through a back surface of the substrate, opposite the top surface of the substrate, the conductive via being electrically connected to the first conductive layer.

19. The method of claim 18, wherein the conductive via has vertical or tapered sidewalls.

20. A semiconductor device, comprising:
   a substrate;
   a first conductive layer formed over a top surface of the substrate;
   a first insulating layer formed over the substrate;

a first dielectric layer formed over the first insulating layer;

a second conductive layer formed over the first conductive layer and first dielectric layer;

a second dielectric layer formed over the second conductive layer;

a polymer material deposited over the second dielectric layer and second conductive layer; and a third conductive layer formed over the polymer material and second conductive layer, the third conductive layer being electrically connected to the second conductive layer.

21. The semiconductor device of claim 20, further including a conductive via formed through a back surface of the substrate, opposite the top surface of the substrate, the conductive via being electrically connected to the first conductive layer.

22. The semiconductor device of claim 21, wherein the conductive via has vertical or tapered sidewalls.

23. The semiconductor device of claim 21, further including:

a fourth conductive layer formed over the back surface of the substrate and into the conductive via, the fourth conductive layer being electrically connected to the first conductive layer;

a second insulating layer formed over the fourth conductive layer; and a second solder bump formed over the fourth conductive layer.

24. The semiconductor device of claim 20, wherein the polymer material has a coefficient of thermal expansion (CTE) which is less than CTE of the second dielectric layer, second conductive layer, and third conductive layer.

* * * * *